(12) United States Patent
Kugo

(10) Patent No.: US 6,315,577 B1
(45) Date of Patent: Nov. 13, 2001

(54) ELECTRONIC COMPONENT WITH LEAD AND LEAD TERMINAL

(75) Inventor: Daisaku Kugo, Toyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/640,816

(22) Filed: Aug. 17, 2000

(30) Foreign Application Priority Data

Aug. 17, 1999 (JP) .................................................. 11-230388

(51) Int. Cl.[7] .................................................. H01R 12/00
(52) U.S. Cl. .................................................. 439/72; 310/320
(58) Field of Search .................. 439/68–73; 310/320, 310/340, 366, 348

(56) References Cited

U.S. PATENT DOCUMENTS

| 5,091,671 | * | 2/1992 | Yoshida | 310/358 |
| 5,096,425 | * | 3/1992 | Takahashi et al. | 439/55 |
| 5,166,570 | * | 11/1992 | Takahashi | 310/320 |
| 5,184,043 | * | 2/1993 | Yoshinaga | 310/320 |
| 5,345,136 | * | 9/1994 | Takagi et al. | 310/320 |
| 5,596,244 | * | 1/1997 | Kugou et al. | 310/348 |
| 5,942,836 | * | 8/1999 | Yoshida et al. | 310/320 |
| 6,087,763 | * | 7/2000 | Kim et al. | 310/348 |

* cited by examiner

Primary Examiner—Brian Sircus
Assistant Examiner—Son V. Nguyen
(74) Attorney, Agent, or Firm—Keating & Bennett, LLP

(57) ABSTRACT

An electronic component includes leads which are capable of absorbing impacts during insertion into a printed circuit board and which are superior in terminal pull-out strength and torsional resistance of the terminal. In electronic components having leads, a plurality of lead terminals are joined with a piezoelectric resonator as an electronic component element, and the lead terminals include flat fitting parts provided in the vicinity of first end parts, kinks provided between the fitting parts and second end parts, and first and second flat parts provided between the fitting parts and the kinks.

17 Claims, 5 Drawing Sheets

ELECTRONIC COMPONENT WITH LEAD AND LEAD TERMINAL

BACKGROUND OF THE INVENTION

1. Field of the Invention

The present invention relates to electronic components having lead terminals that include substantially cylindrical wires, and relates to the lead terminals.

2. Description of the Related Art

Electronic components having leads with lead terminals joined thereto have been extensively used as electronic component elements such as piezoelectric resonators.

FIG. 5 is a schematic perspective view showing a piezoelectric resonator component as an example of a conventional electronic component having leads.

In a piezoelectric resonator component 51, a plurality of lead terminals 53 to 55 are connected to a piezoelectric resonator 52 shown in phantom line. Although not shown in the figure, a remaining portion, excluding a portion in the vicinity of an end portion opposite to the side to be joined to the piezoelectric resonator 52, of the lead terminals 53 to 55 is covered by an exterior resin layer C.

The above-described lead terminals 53 to 55 are made by bending a flat metal sheet. A portion in the vicinity of one end portion of the lead terminal 53 is a terminal fitting part 53a, and is electrically and mechanically connected to an electrode (not shown) of the piezoelectric resonator 52 with solder or other suitable connection element. A stopper 53b is provided in the center of the lead terminal 53 in its longitudinal direction. The stopper 53b is configured to be wider than an end part 54c of a side to be inserted in a printed circuit board or other suitable device of the lead terminal 53. The stopper 53b is provided to adjust the insertion depth when the printed circuit board is inserted in a fitting hole.

The lead terminals 53 to 55 are formed by punching a metal sheet and by bending a part of the punched metal sheet.

Thus, the lead terminals 53 to 55 are easily formed by punching and bending a metal sheet.

However, the lead terminals 53 to 55 formed from a flat metal sheet are thinner than lead terminals formed of a cylindrical wire. Thus, extra parts of the lead terminals 53 to 55 are often unsuccessfully cut by an automatic inserting machine.

Also, during automatic mounting, the lead terminal 53 is inserted in a through hole in a printed circuit board, and a tip side of the lead terminal 53 is often bent in the direction that is perpendicular relative to the axial direction of the through hole, i.e., is often cut and crimped. However, in the above-described lead terminals 53 to 55, no part to absorb impact is present between the exterior resin layer C and the stopper 53b. Thus, exterior resin layers and piezoelectric resonators are often cracked by the impacts generated by the cutting and crimping.

To prevent such cracks, tests have been tried to increase the strength of the exterior resin layer C, but when the strength of the exterior resin layer C is increased, the electric characteristics of the piezoelectric resonator are often adversely affected.

A lead terminal 56 shown in FIG. 6 is also proposed in order to improve cutting ability when cutting off extra parts of the lead terminal in the automatic inserting machine. The lead terminal 56 is provided by preparing a cylindrical wire, and flattening a part in the vicinity of one end part of the cylindrical wire to form a fitting part 56a and a flat stopper 56b which is wider than the fitting part 56a.

A portion 56c of the lead terminal 56 which is led out of the exterior resin layer and is inserted in the through hole in the printed circuit board is cylindrical, and thus, the ability to cut off extra portions of the lead terminal is improved in mounting by the automatic inserting machine.

However, no impact absorbing part is present either in the lead terminal 56 between the exterior resin layer and the stopper 56b, and thus, exterior resin layers and piezoelectric resonators are often cracked by impacts during the cutting and crimping work.

In addition, the stopper 56b is formed by flattening a cylindrical wire, and thus, the thickness of the wide stopper 56b is likely to be very thin, causing a problem in that the bending strength of the lead terminal 56 is degraded.

On the other hand, lead terminals 57 and 58 shown in FIG. 7 are well known to absorb impacts in the above-described automatic mounting. The lead terminals 57 and 58 are extensively used as lead terminals in a capacitor element 59. That is, kinks 57a and 58a which are formed by bending a portion of the cylindrical wire and are curved from side to side are provided on the lead terminals 57 and 58. Since the kinks 57a and 58a are formed, the impact in mounting on the printed circuit board is effectively absorbed by the kinks 57a and 58a.

However, when the lead terminals 57 and 58 are applied to piezoelectric components such as piezoelectric resonators, it is necessary to provide a cavity so as not to interfere with the oscillation of the piezoelectric resonator within the exterior resin layer. Furthermore, to miniaturize the product, it is necessary to reduce the dimensions of the portion of the lead terminals to be covered with the exterior resin. As a result, the pull-out strength of the lead terminals 57 and 58 against the exterior resin layer is insufficient if the lead terminals 57 and 58 formed of the cylindrical wire having only the kinks 57a and 58a are used in the piezoelectric resonator. At the same time, if a torsional force is applied to twist the lead terminals 57 and 58 in the axial direction, the lead terminals 57 and 58 are easily twisted, so that there is a concern that the exterior resin layer will be cracked and that portions joined to the piezoelectric resonator will be broken.

SUMMARY OF THE INVENTION

To overcome the above described problems, preferred embodiments of the present invention provide electronic components having leads which are provided with lead terminals that are capable of overcoming disadvantages in the above-described conventional technology, and absorbing impacts during automatic mounting on printed circuit boards, and which are superior in pull-out strength against the exterior resin layer and are also superior in torsional strength in the axial direction, and to provide such lead terminals in the electronic components.

Electronic components having leads according to preferred embodiments of the present invention include electronic component elements, plural lead terminals which are provided with first and second end parts and which are joined with the above-described electronic component elements at the first end part side, and an exterior resin layer to cover the above-described electronic component elements with a part in the vicinity of the second end part of the above-described lead terminals exposed, wherein at least one of the lead terminals is made by providing a cylindrical wire having a fitting part having a flattened portion in the vicinity of the first end part, a kink bent between the first and second end parts, and first and second flat parts provided at the position to be covered by the exterior resin layer between the fitting part and the kink.

The above-described exterior resin layer is preferably provided with a relatively soft inner first exterior resin layer and a relatively hard outer second exterior resin layer, wherein the first flat part is covered with the first exterior resin layer and the second flat part is covered with the second exterior resin layer.

According to one preferred embodiment of the present invention, the above-described electronic component elements are preferably piezoelectric elements, and a cavity is provided around an oscillating portion of the piezoelectric element so as not to interfere with the oscillating of the piezoelectric element.

The lead terminal of preferred embodiments of the present invention is used for electronic components having leads, and is formed by providing the cylindrical wire with a fitting part flattened in the vicinity of the first end part, the kink bent between the first and second end parts, and the first and second flat parts provided between the fitting part and the kink.

Other features, characteristics, elements and advantages of the present invention will become apparent from the following description of preferred embodiments thereof with reference to the attached drawings.

DETAILED DESCRIPTION OF PREFERRED EMBODIMENTS

Preferred embodiments of the present invention will be described with specific reference to the drawings.

Figure 1A:
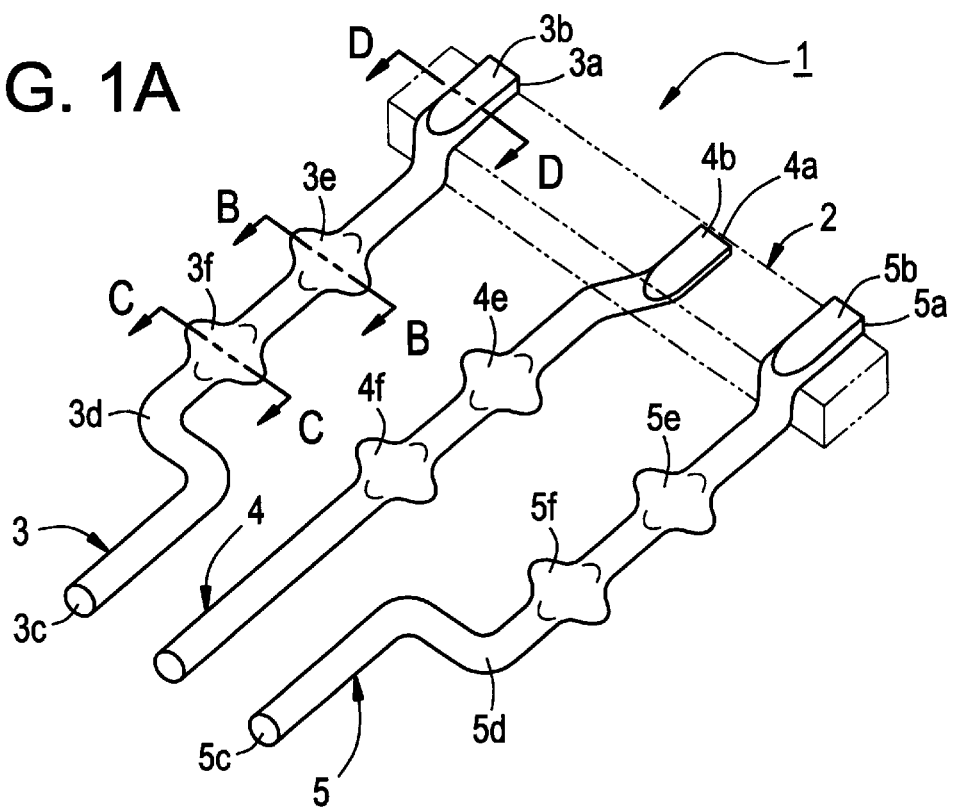
FIG. 1A is a schematic perspective view of an electronic component having leads of a preferred embodiment of the present invention.

FIG. 1A is a schematic perspective view describing an electronic component having leads of the first preferred embodiment of the present invention.

In the electronic component having leads of the present preferred embodiment, a plurality of lead terminals 3 to 5 are joined to a piezoelectric oscillator 2 shown in phantom line. More specifically, the piezoelectric oscillator 2 includes a piezoelectric resonator 6 using the thickness shear mode joined with a plate-like capacitor 7 as shown in FIG. 2B. The piezoelectric resonator 6 includes an excitation electrode 6b (an excitation electrode on the other surface side is not shown) provided on first and second main surfaces of a substantially rectangular flat piezoelectric ceramic plate 6a. The excitation electrode on the second main surface side is electrically connected to a connection conductive part 6c leading to the first main surface on which the excitation electrode 6b is provided. The piezoelectric ceramic 6a is polarized in the direction of the arrow P in the figure.

The capacitor 7 includes capacitor electrodes 7b and 7c provided on one surface of a dielectric substrate 7a, and capacitor electrodes (not shown) provided on an approximately central area of the other surface so as to be partially overlapped on the capacitor electrodes 7a and 7c.

The excitation electrode 6b is electrically connected to the capacitor electrode 7b of the capacitor 7. Excitation electrodes on the side not shown in the figure are electrically connected to the capacitor electrode 7c.

Again, in FIG. 1A, the lead terminal 3 is electrically connected to the above-described excitation electrode 6b, the lead terminal 4 is electrically connected to the capacitor electrode provided on the surface not shown in the figure of the dielectric substrate 7a, and the lead terminal 5 is electrically connected to the excitation electrode on the side not shown in the figure, and is electrically connected to the connection conductive part 6c leading to the first main surface of the piezoelectric ceramic plate 6a.

Lead terminals 3 to 5 are provided with fitting parts 3b to 5b made by flattening a tip of a substantially cylindrical wire in the vicinity of first end parts 3a, 4a and 5a, respectively. The fitting parts 3b to 5b are joined with the piezoelectric oscillator 2 via solder or other suitable connection mechanism.

Kinks 3d and 5d are provided between second end parts 3c and 5c and the fitting parts 3b and 5b in the lead terminals 3 and 5. No kink is provided on the lead terminal 4.

The kinks 3d and 5d are made by bending a substantially cylindrical wire, and impacts during mounting on a printed circuit board or other suitable component by an automatic inserting machine are absorbed by the kinks 3d and 5d.

First and second flat parts 3e, 5e, 3f and 5f are provided successively from the first end parts 3a and 5a sides between the kinks 3d, 5d and the fitting parts 3b, 5b, respectively. Also, in the lead terminal 4, first and second flat parts 4e and 4f are provided between the second end part 3c and the fitting part 4a.

Figure 1B:
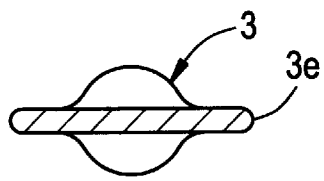
FIG. 1B to FIG. 1D are sectional views along line B—B, line C—C and line D—D, respectively, in FIG. 1A.
Figure 1C:
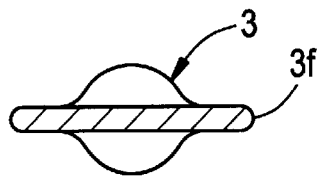

Referring to the lead terminal 3, the sectional shapes of the flat parts 3e and 3f are shown in FIG. 1B and FIG. 1C.

As shown in FIG. 1B and FIG. 1C, in the flat parts 3e and 3f, each substantially cylindrical wire is flattened. The dimension of the widest parts of the flat parts 3e and 3f is preferably larger than the diameter of the substantially cylindrical wire. Thus, the flat parts 3e and 3f extend substantially perpendicularly to the axial direction at one portion of the substantially cylindrical wire.

Figure 2A:
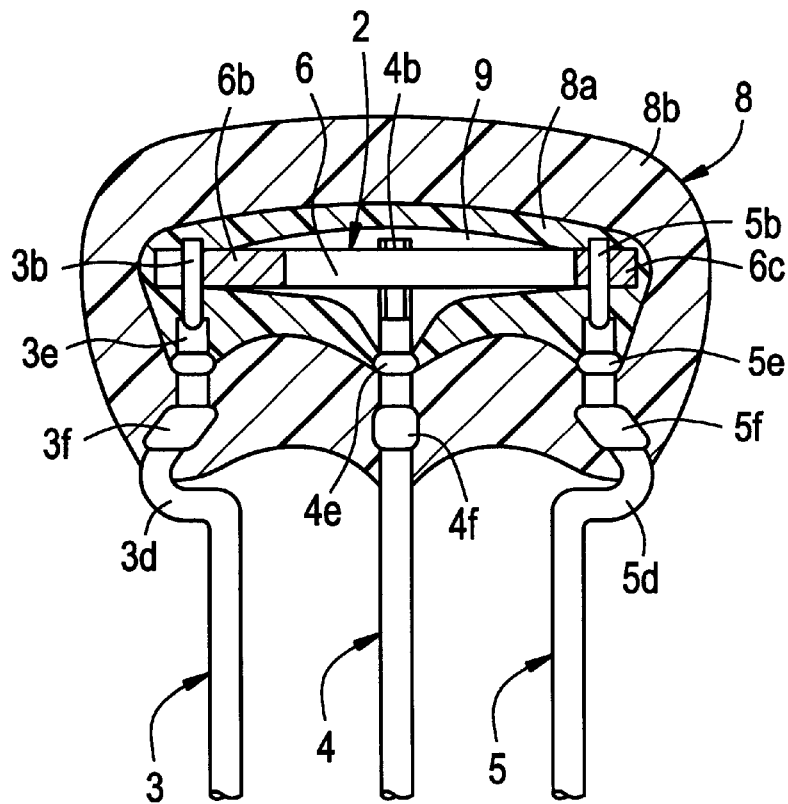
FIG. 2A is a sectional view of the electronic components having leads of a preferred embodiment of the present invention.
Figure 2B:
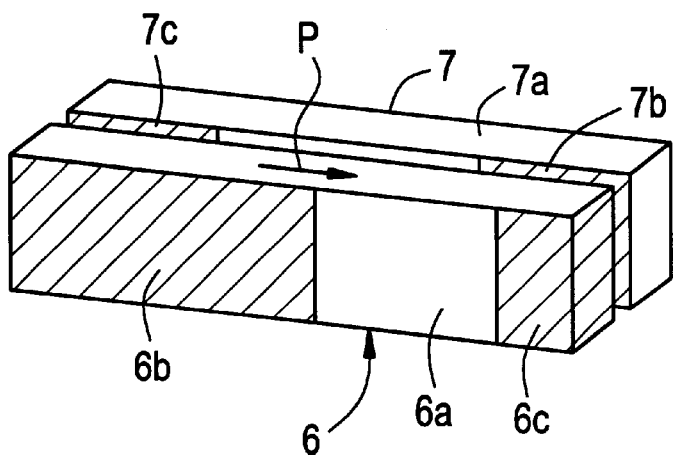
FIG. 2B is a perspective view of the structure of a piezoelectric oscillator used in the preferred embodiment.

The above-described lead terminals 3 to 5 are joined with the piezoelectric oscillator 2 to define an exterior resin layer 8 shown in FIG. 2. In the present preferred embodiment of the present invention, a cavity 9 is provided within the exterior resin layer 8 so as not to interfere with the oscillation of the piezoelectric resonator 6.

The exterior resin layer 8 includes a relatively soft inner first exterior resin layer 8a and a relatively hard outer second exterior resin layer 8b. The relatively soft first exterior resin layer 8a includes a thermosetting resin, such as an epoxy resin, and is preferably made using a relatively porous material with increased wax absorption. The relatively hard outer second exterior resin layer 8b is made using a thermosetting resin such as an epoxy resin.

The exterior resin layer 8 of such a double-layered structure is provided so that the oscillation of the piezoelectric resonator 6 is not damped by the soft first exterior resin layer 8a, and so that the mechanical strength is increased by the outer hard exterior resin layer 8b.

In the above-described lead terminals 3 to 5, the first flat parts 3e to 5e are covered by the first exterior resin layer 8a, and the second flat parts 3f to 5f are covered by the second exterior resin layer 8b.

Thus, when external force is applied in the pull-out direction of the lead terminals 3 to 5, the pull-out strength is substantially increased because the second flat parts 3f to 5f are embedded in the second exterior resin layer 8b. Also, during automatic insertion, even when there is external force twisting of the lead terminals 3 to 5 in the axial direction, the torsional resistance is substantially increased against such an external force because the second flat parts 3f–5f are embedded in the hard exterior resin layer 8b, and the joining of the piezoelectric oscillator with the lead terminals 3 to 5 is difficult to break.

The above-described cavity 9 is formed by applying a wax around an oscillation portion of the piezoelectric resonator 6, covering it with an exterior resin, and absorbing the wax by the heat produced in curing the exterior resin. In such a case, the molten wax is likely to flow and spread. However, in the electronic components having leads of the present preferred embodiment, the first flat parts 3e to 5e are provided in the vicinity of the fitting parts 3b to 5b, and thus, the wax is prevented from spreading to the flat parts 3e to 5e. Similarly, molten solder is prevented from flowing by the first flat parts 3e to 5e when the fitting parts 3b to 5b are joined with the piezoelectric oscillator 2 with solder.

Figure 1D:

In addition, the terminal fitting parts 3b to 5b are flattened as shown in FIG. 1D, and the joining strength of the piezoelectric oscillator 2 with the lead terminals 3 to 5 with solder is substantially increased.

Figure 3:
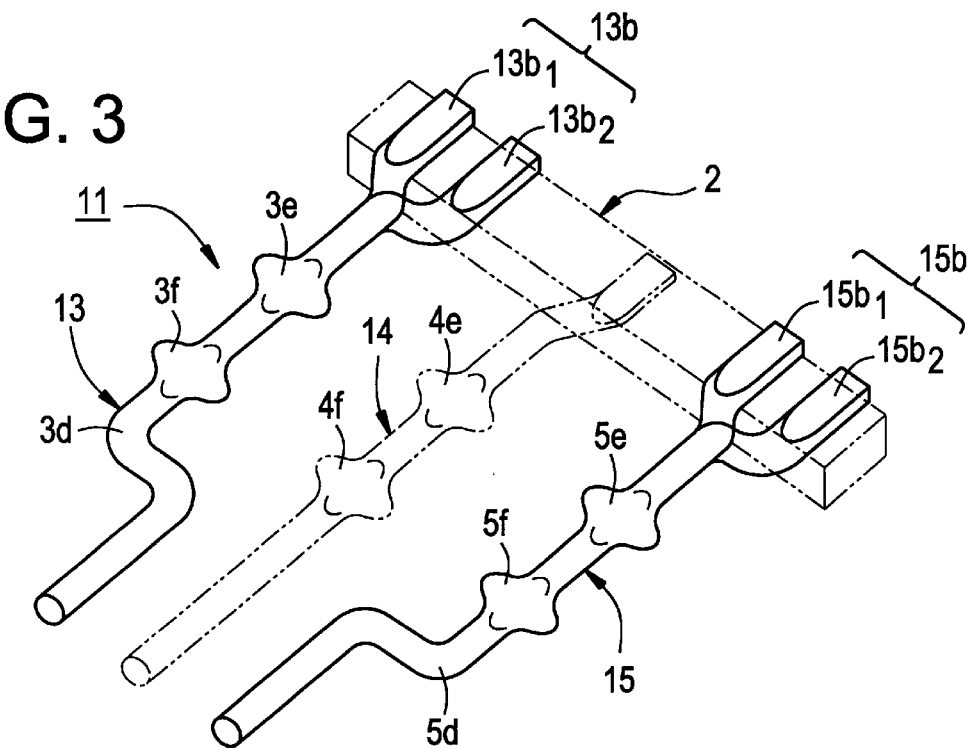
FIG. 3 is a perspective view of a modification of the electronic components having leads of another preferred embodiment of the present invention.

FIG. 3 is a perspective view to illustrate a second preferred embodiment of the electronic component of the present invention. In the electronic component having leads 11, a plurality of lead terminals 13 to 15 are joined to the piezoelectric oscillator 2 drawn in phantom line. A lead terminal 14 is constructed similarly to the lead terminal 4 of the above-described preferred embodiment.

Lead terminals 13 and 15 are constructed similarly to the lead terminals 3 and 5 of the above-described preferred embodiment, except for the fitting parts 13b and 15b. Thus, the same parts as those of the lead terminals 3 and 5 are denoted by the same reference numerals.

That is, the fitting parts 13b and 15b are formed by dividing the tip of the substantially cylindrical wire into two portions in the axial direction, and respectively flattening the divided parts. Thus, the fitting parts 13b and 15b have flattened branched portions $13b_1$, $13b_2$, $15b_1$ and $15b_2$. The branched portions $13b_1$, and $13b_2$, and the branched portions $15b_1$ and $15b_2$ are configured to hold the piezoelectric oscillator 2 therebetween. In the electronic components having leads of this preferred embodiment, the fitting parts 13b and 15b of the lead terminals 13 and 15 have the above-described branched portions $13b_1$ and $15b_1$ and $15b_2$, and are fixed to the piezoelectric oscillator 2 so as to hold first and second main surfaces of the piezoelectric oscillator 2.

Other elements are constructed similarly to those of the electronic components having leads 1 of the first preferred embodiment, and the description in the first preferred embodiment is similar therefor. Description thereof is thus omitted.

Figure 4:
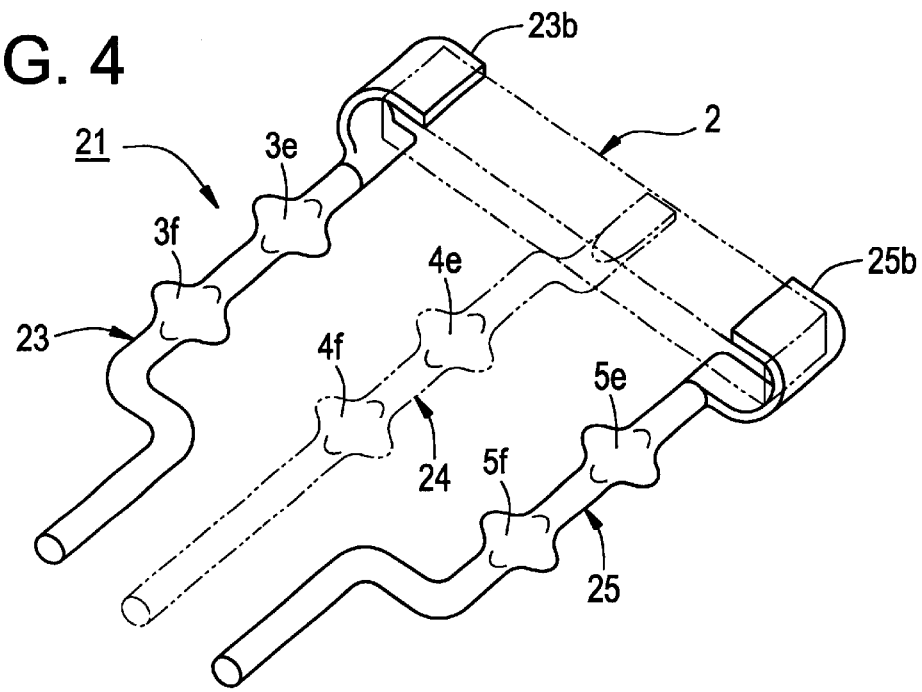
FIG. 4 is a perspective view of another modification of the electronic components having leads of a further preferred embodiment of the present invention.
Figure 5:
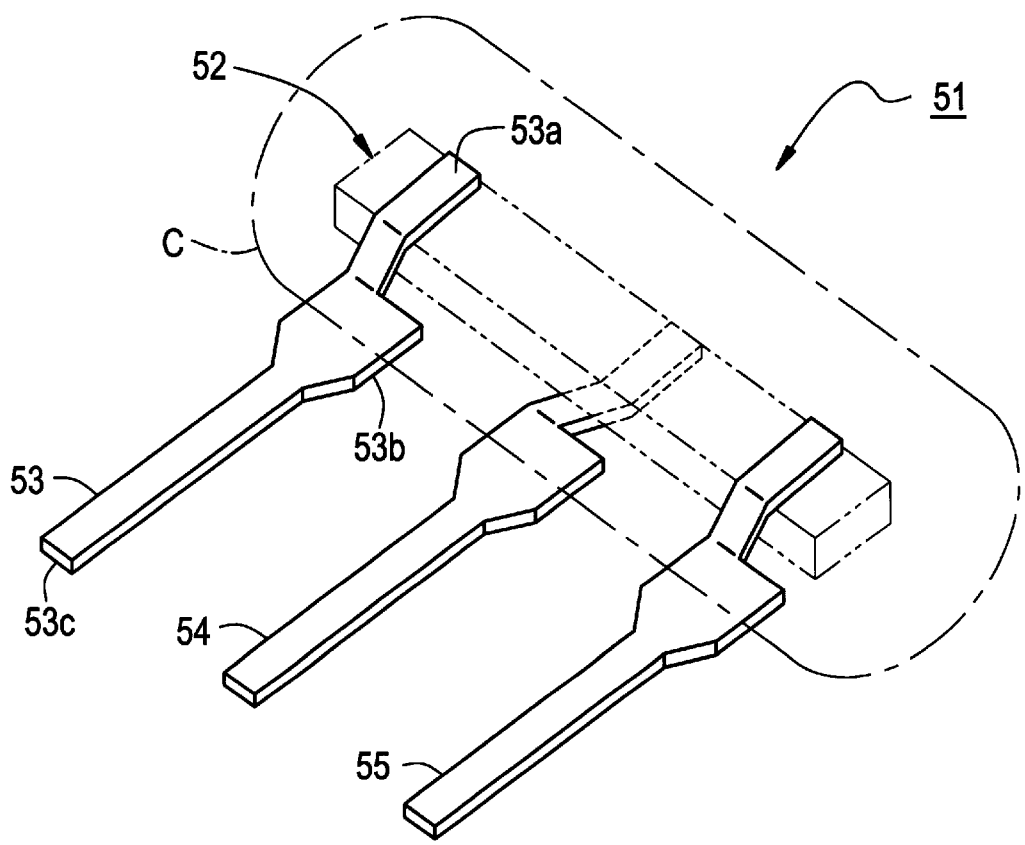
FIG. 5 is a schematic perspective view of one example of a conventional electronic component having leads.
Figure 6:
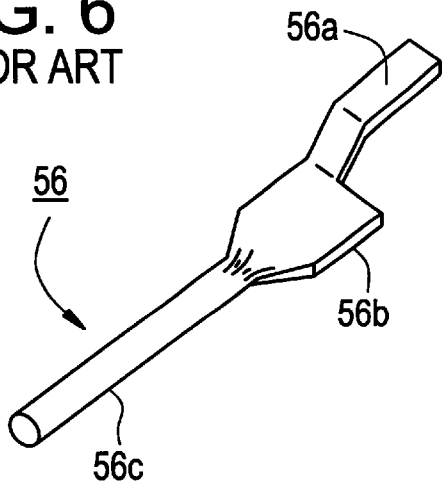
FIG. 6 is a perspective view of another example of a conventional lead terminal.
Figure 7:
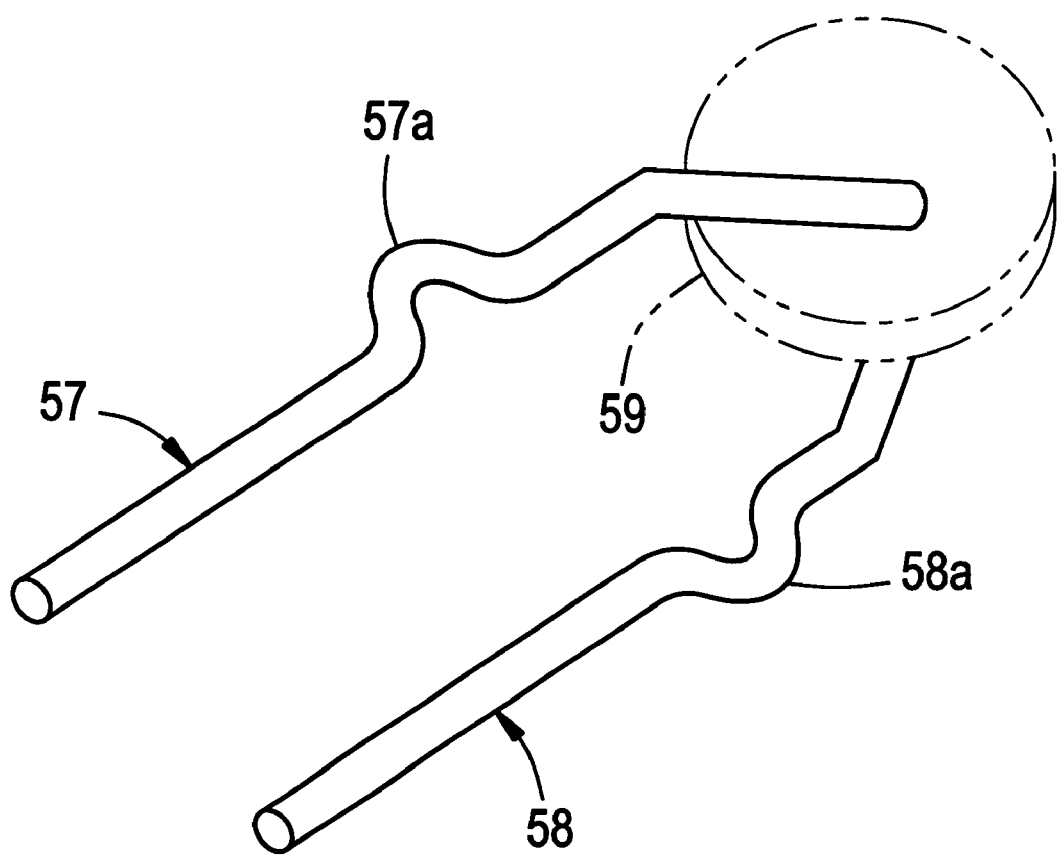
FIG. 7 is a perspective view of still another example of a conventional lead terminal.

FIG. 4 is a perspective view showing still another preferred embodiment of the electronic components of the present invention having leads. The electronic components having leads 21 of this preferred embodiment are similar to the electronic components having leads of the first preferred embodiment except that fitting parts 23b and 25b of the lead terminals 23 and 25 are different from the lead terminals 3 and 5.

The fitting parts 23b and 25b of the lead terminals 23 and 25 are formed by flattening a substantially cylindrical wire and bending it so that it has an approximately U-shaped section. Thus, the fitting parts 23b and 25b are joined with the piezoelectric oscillator 2 in a shape to hold the end parts of the piezoelectric oscillator 2.

As described above, the shape of the flattened fitting parts in the lead terminals of the present invention can be appropriately modified.

In the above-described preferred embodiments, the present invention is applied to a three-terminal type piezoelectric oscillator in which the piezoelectric resonator 6 is joined to the capacitor 7, but the present invention is also applicable to piezoelectric resonators of other structures including filters, traps, and discriminators, and other suitable piezoelectric resonators, is applicable to electronic components having leads which are formed by joining a lead terminal to electronic components other than the piezoelectric resonator, and covering them with exterior resin.

In the above-described preferred embodiments, the cavity 9 is provided around the oscillation part of the piezoelectric resonator 6 using a wax, but the cavity 9 may be omitted if the first exterior resin layer 8a is formed of a silicone resin. In this construction, the first flat parts 3e to 5e prevent the flow of the silicone resin.

In the above-described preferred embodiments, no kink is provided on the lead terminal 4, but a kink may be provided on every lead terminal. In short, the present invention is generally applicable to electronic components having leads to which a plurality of lead terminals having the above-described first and second flat parts, fitting parts, and kinks are joined, and in such a case, a kink need not be formed in every lead terminal.

The substantially cylindrical wire used in forming the lead terminals 3 to 5 can be made of appropriate metals or alloys, including Cu and Ag.

In the electronic components having leads of the preferred embodiments of the present invention, at least two lead terminals to be joined to electronic component elements are formed by providing a substantially cylindrical wire and are firmly bonded with solder or other suitable bonding material to the electronic component elements by the flattened fitting parts provided in the vicinity of the first end part. At the same time, impacts during insertion into the printed circuit board are mitigated by the kink bent between the first and second end parts, and generation of cracks in the exterior resin layers and the electronic component elements are substantially reduced. In addition, the first and second flat parts are provided between the fitting parts and the kinks, and the flow-out of the molten solder and wax from the fitting part side are reliably suppressed by the first flat part, the pull-out strength of the lead terminals is increased by the second flat part, and the torsional resistance when the external force is applied to the lead terminal around its axial direction is also substantially increased.

Since the resistance against impacts in mounting the electronic parts having leads on the printed circuit board by an automatic inserting machine or the external force to be applied during the cutting and crimping works is increased, the electronic components having leads which are easily and securely mounted on the printed circuit board using an automatic inserting machine are provided.

When the exterior resin layer is provided with the first and second exterior resin layers, and the first flat layer is covered by the first exterior resin layer and the second flat part is covered by the second exterior resin layer, the lead terminal pull-out strength and the torsional resistance can thereby be significantly improved because the second flat part is covered with the relatively hard second exterior resin layer. Although the first flat part is covered with the relatively soft first exterior resin layer, it reliably prevents the flow-out of the molten solder and wax.

When a piezoelectric element is used for an electronic component element and a cavity is provided around the piezoelectric element so as not to interfere with the oscillation, the flow-out of the wax is reliably suppressed by the first flat part even when the wax to be dispersed by heating is used in forming the cavity. Thus, piezoelectric resonator parts having leads which are superior in terminal pull-out strength and torsional resistance are provided.

The lead terminals of preferred embodiments of the present invention are preferably provided with the above-described fitting parts, first and second flat parts and kinks, firmly joined with the electronic component elements using solder or other suitable bonding material, and impacts applied during mounting on the printed circuit board by the automatic inserting machine are reliably absorbed, and the strength against external force applied during mounting is effectively increased.

It should be understood that the foregoing description is only illustrative of the present invention. Various alternatives and modifications can be devised by those skilled in the art without departing from the invention. Accordingly, the present invention is intended to embrace all such alternatives, modifications and variations which fall within the scope of the appended claims.

What is claimed is:

1. An electronic component comprising:
   a plurality of electronic component elements;
   a plurality of lead terminals including first and second end parts and joined to said electronic component elements at the first end part; and
   an exterior resin layer covering said electronic component elements with a portion in the vicinity of the first end part of said lead terminals exposed;
   wherein at least one of said lead terminals includes a substantially cylindrical wire having a fitting part with a flattened portion in the vicinity of the first end part, a kink bent between the first and second end parts, and first and second flat portions spaced apart from one another in a longitudinal direction of the substantially cylindrical wire and provided at the position to be covered with said exterior resin layer between said fitting part and said kink.

2. An electronic component according to claim 1, wherein said exterior resin layer is provided with a relatively soft inner first exterior resin layer and a relatively hard outer second exterior resin layer, and said first flat portion is covered with the first exterior resin layer and said second flat portion is covered with the second exterior resin layer.

3. The electronic component according to claim 2, wherein said relatively soft inner first exterior resin layer is a thermosetting resin.

4. The electronic component according to claim 2, wherein said relatively hard outer second exterior resin layer is a thermosetting resin.

5. The electronic component according to claim 1, wherein three of said lead terminals are provided, and no kink is provided in one of the lead terminals located between the other two lead terminals.

6. The electronic component according to claim 2, wherein three of said lead terminals are provided, and no kink is provided in one of the lead terminals located between the other two lead terminals.

7. The electronic component according to claim 1, wherein said plurality of electronic component elements are piezoelectric elements, and a cavity is provided around an oscillation portion of the piezoelectric elements so as not to interfere with an oscillation of said piezoelectric elements.

8. The electronic component according to claim 7, wherein three of said lead terminals are provided, and no kink is provided in one of the lead terminals located between the other two lead terminals.

9. The electronic component according to claim 1, wherein said electronic component includes a piezoelectric resonator and a plate-like capacitor, the piezoelectric resonator includes an excitation electrode provided on first and second main surfaces of a substantially rectangular flat piezoelectric ceramic plate, the excitation electrode on the second main surface side is electrically connected to a connection conductive part leading to the excitation electrode on the first main surface.

10. The electronic component according to claim 9, wherein the piezoelectric ceramic is polarized in a longitudinal direction.

11. The electronic component according to claim 9, wherein the plate-like capacitor includes capacitor electrodes provided on one surface of a dielectric substrate, and capacitor electrodes provided at an approximately central area of the other surface so as to be partially overlapped on the capacitor electrodes on the one surface of the dielectric substrate.

12. The electronic component according to claim 1, wherein the fitting part of at least one of said plurality of lead terminals has flattened branched portions configured to hold the electronic component elements therebetween.

13. The electronic component according to claim 1, wherein the fitting part of at least one of said plurality of lead terminals is bent to have an approximately U-shaped section to hold end portions of the electronic component elements.

14. A lead terminal for an electronic component comprising:
   leads defined by a substantially cylindrical wire having first and second end parts provided with a fitting part flattened in a vicinity of the first end part, a kink bent between the first and second end parts, and first and second flat parts spaced apart from one another in a longitudinal direction of the substantially cylindrical wire and provided between said fitting part and said kink.

15. The lead terminal according to claim 14, wherein three of said lead terminals are provided, and no kink is provided in one of the lead terminals located between the other two lead terminals.

16. The lead terminal according to claim 14, wherein the fitting part of at least one of said leads has flattened branched portions configured to hold the electronic component therebetween.

17. The lead terminal according to claim 14, wherein the fitting part of at least one of said leads is bent to have an approximately U-shaped section to hold end portions of the electronic component.

* * * * *